(12) United States Patent
Wu (10) Patent No.: US 7,989,823 B2
(45) Date of Patent: Aug. 2, 2011

(54) LIGHT EMITTING SYSTEM, LIGHT EMITTING APPARATUS AND FORMING METHOD THEREOF

(75) Inventor: Yu Chao Wu, Taipei County (TW)

(73) Assignee: Hong-Yuan Technology Co., Ltd., Taipei County (TW)

( * ) Notice: Subject to any disclaimer, the term of this patent is extended or adjusted under 35 U.S.C. 154(b) by 73 days.

(21) Appl. No.: 12/303,916

(22) PCT Filed: Jun. 8, 2006

(86) PCT No.: PCT/CN2006/001248
§ 371 (c)(1),
(2), (4) Date: May 22, 2009

(87) PCT Pub. No.: WO2007/140651
PCT Pub. Date: Dec. 13, 2007

(65) Prior Publication Data
US 2010/0219430 A1 Sep. 2, 2010

(51) Int. Cl.
*H01L 29/205* (2006.01)
*H01L 21/00* (2006.01)
(52) U.S. Cl. ............... 257/91; 257/98; 257/E33.061; 257/E33.067; 438/27; 438/28
(58) Field of Classification Search ............ 257/91, 257/98, E33.051, E33.061, E33.067; 438/27, 438/28
See application file for complete search history.

(56) References Cited

U.S. PATENT DOCUMENTS

| | | | | |
|---|---|---|---|---|
| 6,008,582 A | * | 12/1999 | Asano et al. | 313/582 |
| 6,531,328 B1 | * | 3/2003 | Chen | 438/26 |
| 6,936,855 B1 | | 8/2005 | Harrah | |
| 7,326,583 B2 | * | 2/2008 | Andrews et al. | 438/26 |
| 2003/0219919 A1 | | 11/2003 | Wang et al. | |
| 2004/0079957 A1 | | 4/2004 | Andrews et al. | |
| 2005/0139846 A1 | | 6/2005 | Park et al. | |

FOREIGN PATENT DOCUMENTS

| | | |
|---|---|---|
| WO | WO03/021691 | 3/2003 |
| WO | WO 2005/081327 A1 | 9/2005 |

* cited by examiner

*Primary Examiner* — Lex Malsawma (57) ABSTRACT

A light emitting system, a light emitting apparatus and the forming method thereof, the light emitting system comprising a plurality of light emitting units (100) and a frame for connecting the light emitting units. Each light emitting unit comprises a substrate (102), one or a plurality of chips (104) disposed on the substrate, an annular member (110) disposed on the substrate and surrounding the chips, the annular member used for adjusting the direction of the light emitted from the chips, and a protective layer (108) covering the chips, wherein the height of the protective layer is not more than that of the annular member.

17 Claims, 8 Drawing Sheets

LIGHT EMITTING SYSTEM, LIGHT
EMITTING APPARATUS AND FORMING
METHOD THEREOF

FIELD OF THE INVENTION

The present invention relates to a light emitting system, light emitting apparatus and forming method thereof, and particularly relates to a Light emitting diodes (LEDs) containing light emitting system, light emitting apparatus and forming method thereof.

DESCRIPTION OF THE RELATED ART

Light emitting diodes (LEDs) have high brightness, low volume, low power consumption and long life and such as, are used in variety of display products. The luminescent principle of LED is as follows. A voltage is applied to a diode to drive an electron and hole combination. The combination releases light from the diode. Furthermore, phosphors can be added into the LED to tune the luminescent wavelength (color) and luminescent intensity of the light.

White LEDs can be used in the lighting field. There are two white LED structures. One is single chip LED. This LED uses a single LED chip and phosphors to obtain white light. For example, a white LED can use a blue LED chip and yellow phosphors or use a UV LED chip, blue, green and red phosphors to obtain a white LED. Another white LED uses a multiple chip LED. This LED uses a plurality of LED chips and phosphors to obtain white light. For example, a white LED can use blue, green and red LED chips to obtain white LED. But the multiple chips LED has a plurality of LED chips, wherein have different driving voltages, luminescent intensity, temperature characteristics and lifetime. Thus, the LED design is more complicated and has higher cost. Accordingly, the single chip LED is more practical.

However, the conventional light-emitting device incorporating the LED suffers from issues such as blue light leakage at side which leads to color shift. In addition, enhancement of heat dissipation efficiency is also needed.

BRIEF SUMMARY OF THE INVENTION

In view of the described problems, one embodiment discloses a light emitting device or light emitting unit. The light emitting device or unit comprises a substrate; at least a chip having a phosphor powder layer on a top surface thereon on the substrate; and an enclosed structure surrounding the chip over the substrate, wherein the enclosed structure adjusts direction of light emitted from the chip; and a passivation layer at least covering the phosphor powder layer, having a height less than that of the enclosed structure.

In another embodiment, the passivation layer is a planarization layer.

In another embodiment, the passivation layer further covers the chip and extends to an interior surface of the enclosed structure.

In another embodiment, the passivation has a thickness t, and the enclosed structure has a thickness h, and wherein the relationship $h/2 \leq t \leq 2h/3$ is fulfilled.

In another embodiment, the enclosed structure comprises plastic body and a reflection material layer thereon.

In another embodiment, the enclosed structure is formed of materials having a reflection surface.

In another embodiment, the phosphor powder layer includes a plurality of phosphor particles and at least part thereof is coagulated and free of adhesive agents.

In another embodiment, the enclosed structure is a trapezium or a triangle.

In another embodiment, the interior surface of the enclosed structure is a planar or arc surface.

The light emitting device further comprises a lens covering the substrate, chip, passivation layer and enclosed structure. The light emitting device further comprises a filling layer between the lens and passivation layer, wherein the filling layer has a substantially same refractivity as that of the passivation layer.

In another embodiment, the passivation layer further covers the chip and extends to an interior surface of the enclosed structure, thus the adhesive force is enhanced.

In another embodiment, the enclosed structure is used for shielding, reflecting, collecting or focusing light emitted from the chip, thus issues such as blue light leakage at side which leads to color shift can be eliminated.

In another embodiment, the enclosed structure is typically formed of plastic materials, and the surface thereof can be covered with a layer of anti-reflection materials such as chromium, nickel, silver, zinc fluoride, or magnesium sulfide by electroplating.

Because the enclosed structure and the chip are disposed on the same side, the heat dissipation can be enhanced if the enclosed structure is formed by materials having high thermal conductivity such as metal.

In another embodiment, in addition to the enclosed structure, a heat dissipation base which can be formed of metal materials is further disposed under the light emitting device, facilitating enhancement of heat dissipation.

In another embodiment, a light emitting system is disclosed. The light emitting system comprises multiple light emitting units and a frame for connecting the light emitting units. Each light emitting unit includes a substrate; one or more chip(s) having a phosphor powder layer on a top surface thereon on the substrate; and an enclosed structure surrounding the one or more chip(s) over the substrate, wherein the enclosed structure adjusts direction of light emitted from the chip; and a passivation layer at least covering the phosphor powder layer, having a height less than that of the enclosed structure.

In another embodiment, a region surrounded by the enclosed structure is square, rectangular, circular or polygonal.

In another embodiment, arrangement of the light emitting units comprises series, parallel, concentric circle, or coil type.

In another embodiment, there is a gap between each substrate of the light emitting units, avoiding heat accumulation.

In another embodiment, a method of fabricating a light emitting device is disclosed. The method comprises providing a substrate having at least a chip thereon; providing an enclosed structure surrounding the chip over the substrate; mixing a plurality of phosphor particles and an adhesive-agent free liquid to form a mixed solution; placing the substrate in the mixed solution so that the phosphor particles precipitating onto the substrate; removing the liquid, resulting in coagulation of the phosphor particles and formation of a phosphor powder layer that is at least adhered to the substrate within the enclosed structure; and forming a passivation layer covering the phosphor powder layer.

In another embodiment, the removal of the liquid comprises performing a first removing step to remove the mixed solution outside the enclosed structure, leaving the mixed solution inside the enclosed structure; and performing a first removing step to dry the mixed solution inside the enclosed structure, resulting in coagulation of the phosphor particles and formation of a phosphor powder layer that is at least adhered on the substrate within the enclosed structure.

In another embodiment, the passivation layer is a planarization layer, and its height can be less than that of the enclosed structure, preferably, at least larger than that of the phosphor powder layer. The height of the passivation layer, for example, can be one half of that of the enclosed structure, or two-third of that of the enclosed structure, or therebetween, thus the passivation layer can properly protect the phosphor powder layer without affection of light emitting efficiency and heat dissipation efficiency at excess thickness. The invention, however, is should not be limited thereto as long as the passivation layer is high enough to cover the chip to avoid scratch of the phosphor powder layer.

Typically, the passivation layer can be flexible polymer materials, thus the chip and the metal conductive line connected there to can be protected because flexibility of the passivation layer eliminate thermal stress generated when the chip emits light. The passivation layer may also interpenetrate the phosphor powder layer to a predetermined depth so that adhesive force at the surface is enhanced. In this embodiment, the passivation layer can be silicon.

In another embodiment, a convex lens can selectively cover the light emitting device or light emitting unit. The convex lens, for example, can be formed of epoxy resin or polyethylene. Alternatively, materials having a refraction index identical to the passivation layer can be selectively filled in the convex lens and the passivation layer. The materials can be silicon.

Throughout the overall specification, the so-called enclosed structure refers to a structure which is a closed structure, and can be any shape such as rectangular, square, or circular. In other embodiments, a stripe-like enclosed structure may be formed to adapt the space in backlight module.

With the use of the enclosed structure of the embodiments, not only light from the side wall of the chip can be gathered but generation of heat sink can be avoided. That is, by means of various arrangements of the enclosed structure, such as series, parallel, concentric circle, or coil arrangement, the chips are separately disposed in different enclosed structures so that generation of heat sink due to gather of chips can be avoided. Specifically, each light emitting unit on a cut substrate is independent in connection to each other through a frame, and is spaced at a certain distance to avoid accumulation of heat. A resultant light emitting system is constructed by the light emitting units. In still another embodiment, more excellent heat dissipation efficiency can be achieved by further utilizing a heat dissipation base underlying each light emitting unit.

In addition, by using the enclosed structure of these embodiments, some problems in conventional precipitation methods can be improved. In other words, the phosphor powder after precipitating onto the substrate would be divided into two regions by the enclosed structure, thus the mixed solution outside the enclosed structure can be easily removed. As a result, only few mixed solution is left in the enclosed structure, and amount of the left mixed solution is far less than that of the original mixed solution, thus a phosphor powder layer can be quickly formed on the chip(s) within the enclosed structure through a baking process, leading to the rise of processing efficiency.

DETAILED DESCRIPTION OF THE INVENTION

The following description is of the best-contemplated mode of carrying out the invention. This description of the light emitting system, arrangement of the enclosed structure, assembly of the heat dissipation base and the light emitting device having the enclosed structure, and application of the enclosed structure in precipitation method is made for the purpose of illustrating the general principles of the invention and should not be taken in a limiting sense. The scope of the invention is best determined by reference to the appended claims.

First Embodiment

Figure 1A:
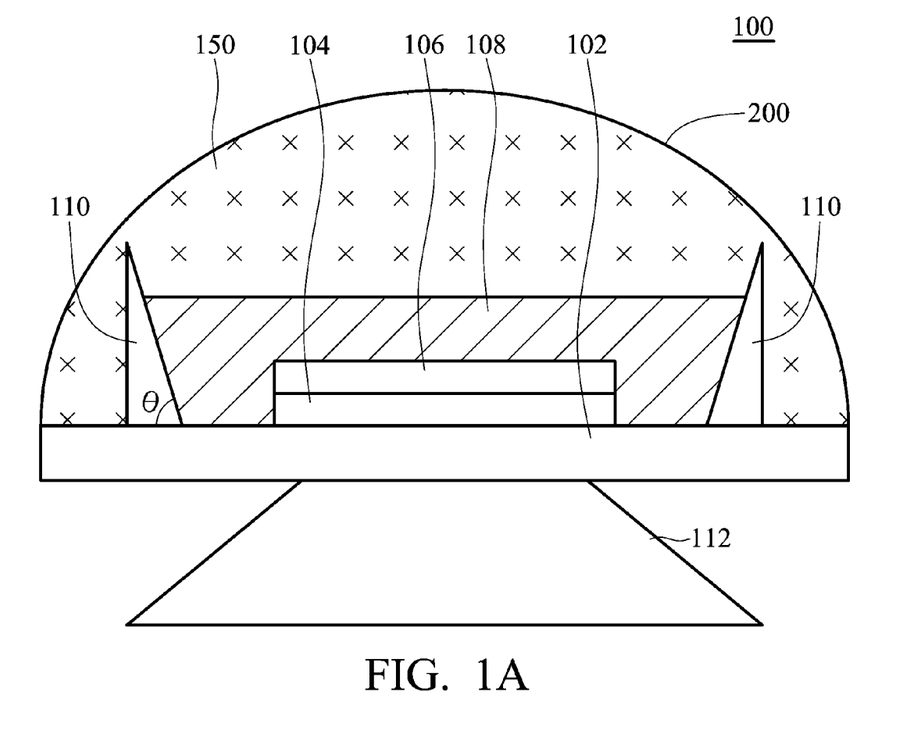
FIG. 1A shows a first embodiment of a light emitting device.
Figure 1B:
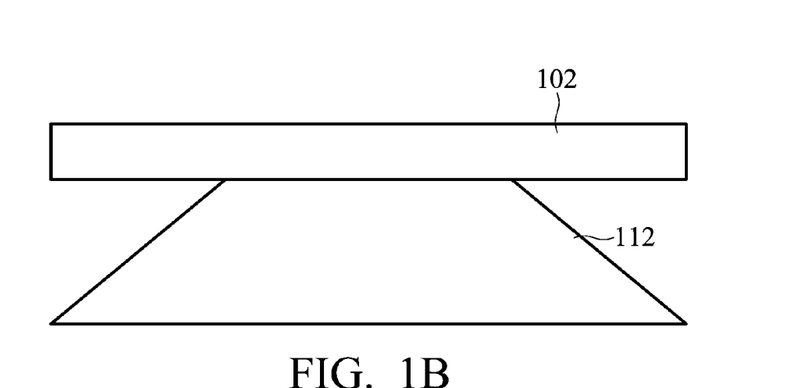
FIG. 1B~1E are various modification types of the heat dissipation base of the light emitting device shown in FIG. 1A.
Figure 1C:
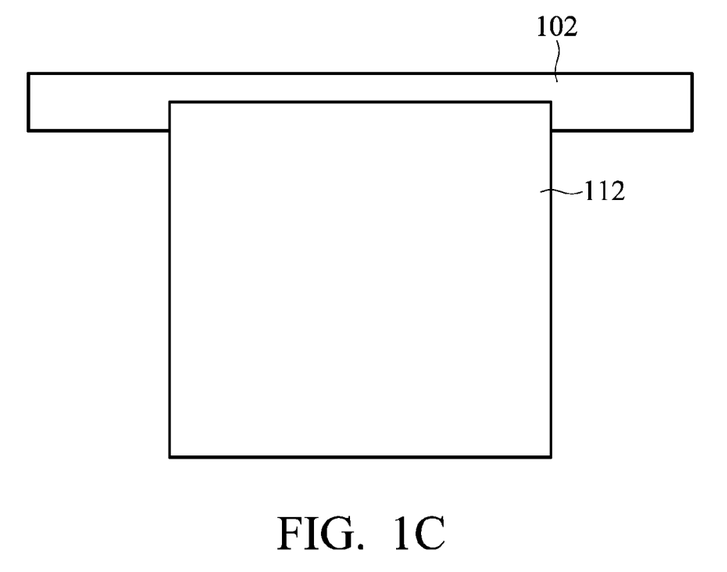
Figure 1D:
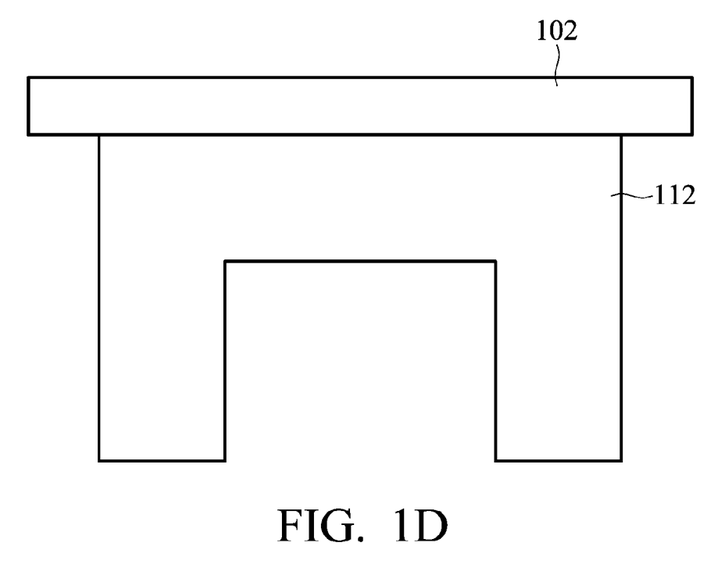
Figure 1E:
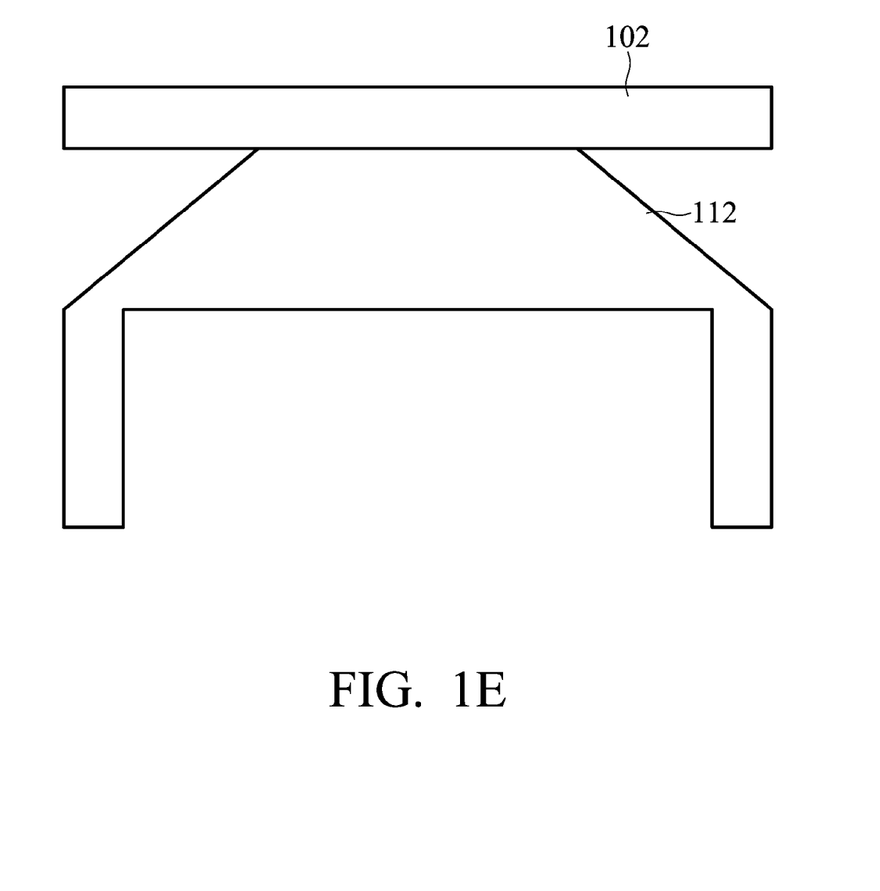
Figure 2A:
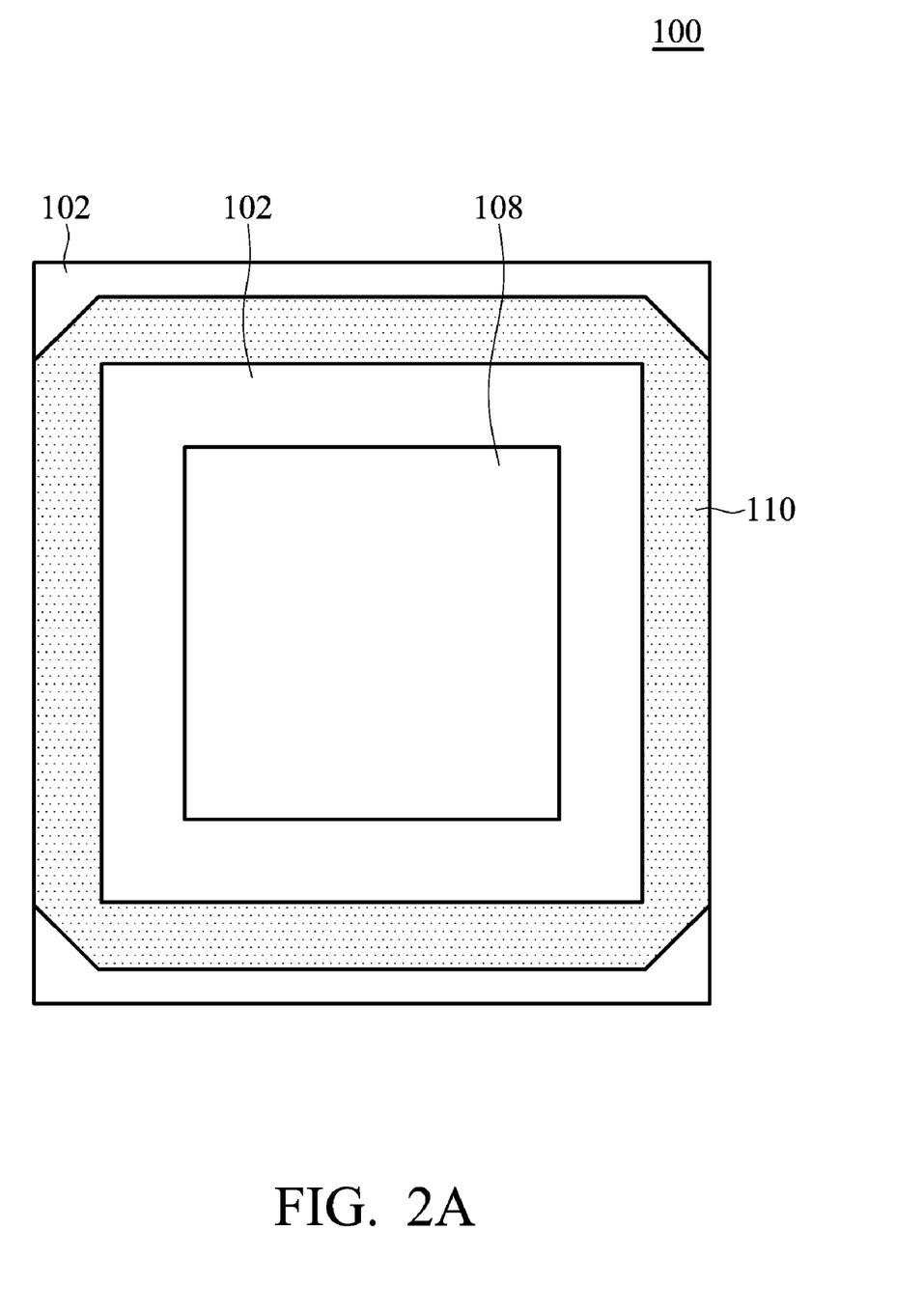
FIG. 2A shows a top view of FIG. 1A.
Figure 2B:
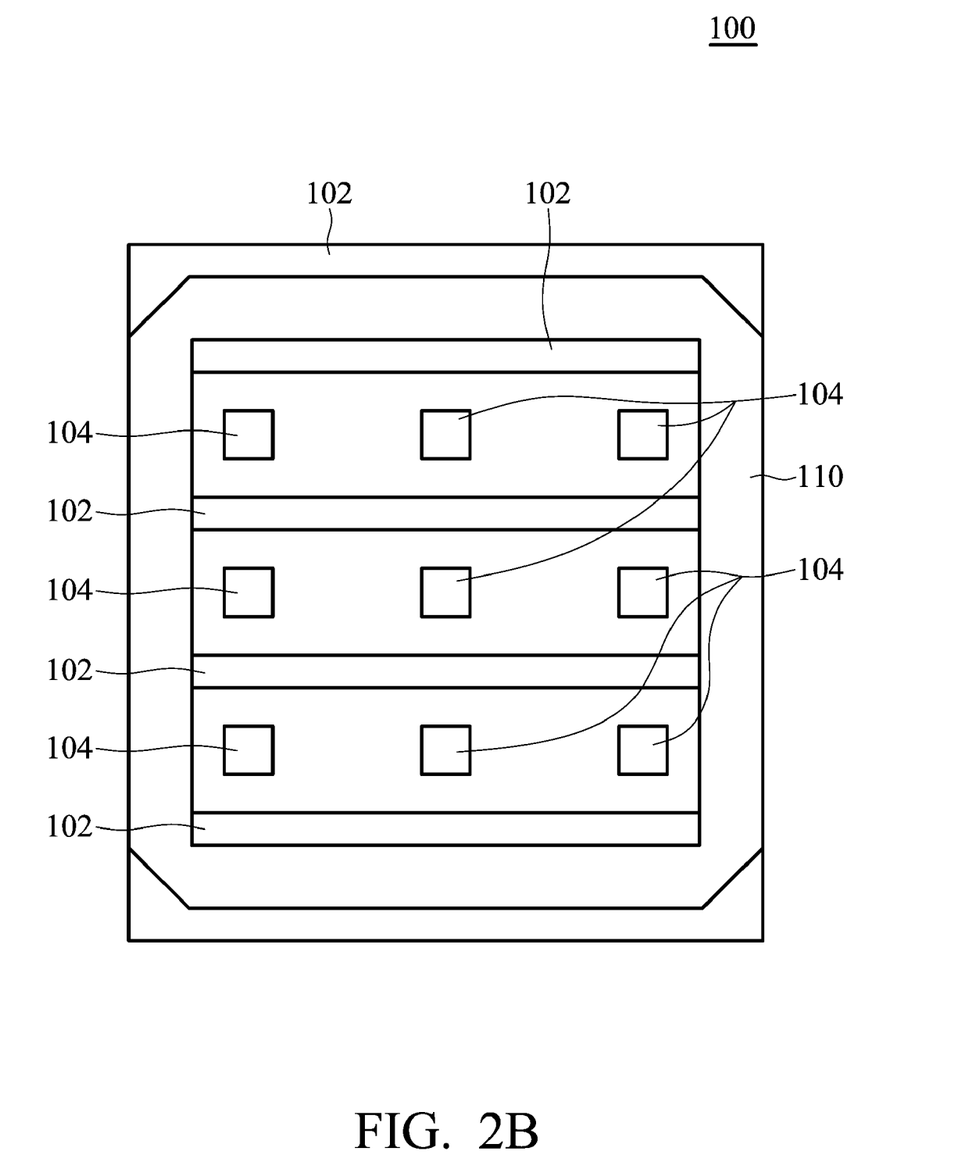
FIG. 2B is a top view of the chip array shown in FIG. 1A.
Figure 3:
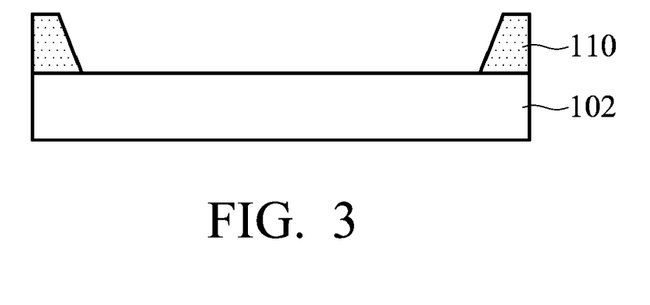
FIG. 3 is a modification type of the enclosed structure shown in FIG. 1A.

FIG. 1A shows a first embodiment of a light emitting device or light emitting unit having an enclosed structure. FIG. 2A shows a top view of FIG. 1A. FIG. 2B is a top view of the chip array shown in FIG. 1A. FIG. 3 is a modification type of the enclosed structure shown in FIG. 1A.

As shown in FIG. 1A, a light emitting device (or light emitting unit) 100 includes a heat dissipation base 112 typically formed of metal. A substrate 102 is on the heat dissipation base 112, and one or more chips is/are on the substrate 102, here, one or more chips is/are shown as a chip array 104. A phosphor powder layer covering the chip array 104, for example, is shown as the phosphor powder layer 106. In one embodiment, the light-emitting device further includes a passivation layer 108 covering the phosphor powder layer 106 and an enclosed structure 110 on the substrate 102. In addition, in this embodiment, the enclosed structure 110 is adhered to the substrate 102 through an adhesive, and the enclosed structure 110 is a closed structure. Hereinafter, the chip array 104, the phosphor powder layer 106 and the passivation layer 108 are disposed within the enclosed structure 110. In this embodiment, the light emitting unit 100 constructs a light emitting system, and the enclosed structure 110 borders a square area, as shown in FIG. 2A. Referring to FIG. 2B, arrangement of the chip array 104 underlying the phosphor powder layer 106 is presented, and the chip array 104 is surrounded by the enclosed structure 110.

In another embodiment, the passivation layer 108 further extends to an interior surface of the enclosed structure 110, thus the adhesive force is enhanced.

Typically, the passivation layer can be flexible polymer materials, thus the chip and the metal conductive line connected there to can be protected because flexibility of the passivation layer eliminate thermal stress generated when the chip emits light. The passivation layer may also interpenetrate the phosphor powder layer 106 to a predetermined depth so that adhesive force at the surface is enhanced. In this embodiment, the passivation layer can be silicon.

In another embodiment, the enclosed structure 110 is used for shielding, reflecting, collecting or focusing light emitted from the chip array 104, thus issues such as blue light leakage at side of the chip array 104 which leads to color shift can be eliminated.

In another embodiment, the enclosed structure 110 is typically formed of plastic materials, and the surface thereof can be covered with a layer of anti-reflection materials such as chromium, nickel, silver, zinc fluoride, or magnesium sulfide by electroplating.

Because the enclosed structure 110 and the chip array 104 are disposed on the same side, the heat dissipation can be enhanced if the enclosed structure is formed by materials having high thermal conductivity such as metal.

In another embodiment, a convex lens 200 can selectively cover the light emitting device or light emitting unit. The convex lens, for example, can be formed of epoxy resin or polyethylene, covering the substrate 102, the chip array 104, the passivation layer 108, and the enclosed structure 110. Alternatively, materials having a refraction index identical to the passivation layer can be selectively filled in the convex lens 200 and the passivation layer 108, serving as a filling layer 150. The materials can be silicon.

In another embodiment, an angle θ (for example, 0°<θ<90°) is formed between the interior side wall of the enclosed structure 110 and the surface of the substrate 102, preferably, θ=90°. The enclosed structure 110 can be formed of metal such as stainless steel, and the enclosed structure 110 can be selectively coated with a film to enhance reflection effect. In another embodiment, the passivation layer is a planarization layer 108, and its height can be less than that of the enclosed structure 110, preferably, at least larger than that of the phosphor powder layer. The height of the passivation layer, for example, can be one half of that of the enclosed structure, or two-third of that of the enclosed structure, or therebetween, thus the passivation layer 108 can properly protect the phosphor powder layer without affection of light emitting efficiency and heat dissipation efficiency at excess thickness. The invention, however, is should not be limited thereto as long as the passivation layer 108 is high enough to cover the chip array 104 to avoid scratch of the phosphor powder layer 106.

Specifically, in this embodiment, there is no adhesive between the phosphor powder in the phosphor powder layer 106, thus improving light emitting efficiency. Number of the chips in the chip array 104 depends on the requirements. In this embodiment, the chip is light emitting diode. The substrate is a copper clad laminate, alternatively, can be an aluminum clad laminate or an aluminum oxide substrate. The heat dissipation base 112 is a trapezium, or a triangle, alternatively, can be rectangular, concave, or other shape for facilitating heat dissipation, as shown in FIGS. 1B~1E. The heat dissipation base 112 can be formed of materials with high conductivity such as metal.

In other embodiments, appropriate modifications depending on the requirements can be made to the shape confined by the enclosed structure 110, for example, the shape can be rectangular, circular, or other shapes. Of course, any change also can be made to the shape of the enclosed structure 110, for example, its section can be a trapezium, triangle, or arc, as shown in FIG. 3. Alternatively, the interior side wall of the enclosed structure can be a planar or arc surface. In other embodiments, the shape confined by the enclosed structure 110 can be any desired shape. For example, a stripe-like enclosed structure may be formed to adapt the space in backlight module.

In one embodiment, two enclosed structures are formed by stainless steel with a same diameter 1.6 cm, one is 0.2 mm high, and the other is 0.3 mm high, and both cross sections of them are equilateral triangle. Both of them are respectively disposed on two substrates with sixteen LED chips (e.g. 14 mil chips) covered by a phosphor powder layer thereon, surrounding the chips to form light emitting devices. Comparison between the two light emitting devices shows that the one utilizing the 0.2 mm-high enclosed structure is brighter than the other, and illumination difference therebetween is 1~2 lm. However, there is no difference in illumination when covered by convex lenses formed of epoxy resin.

Second Embodiment

Figure 4:
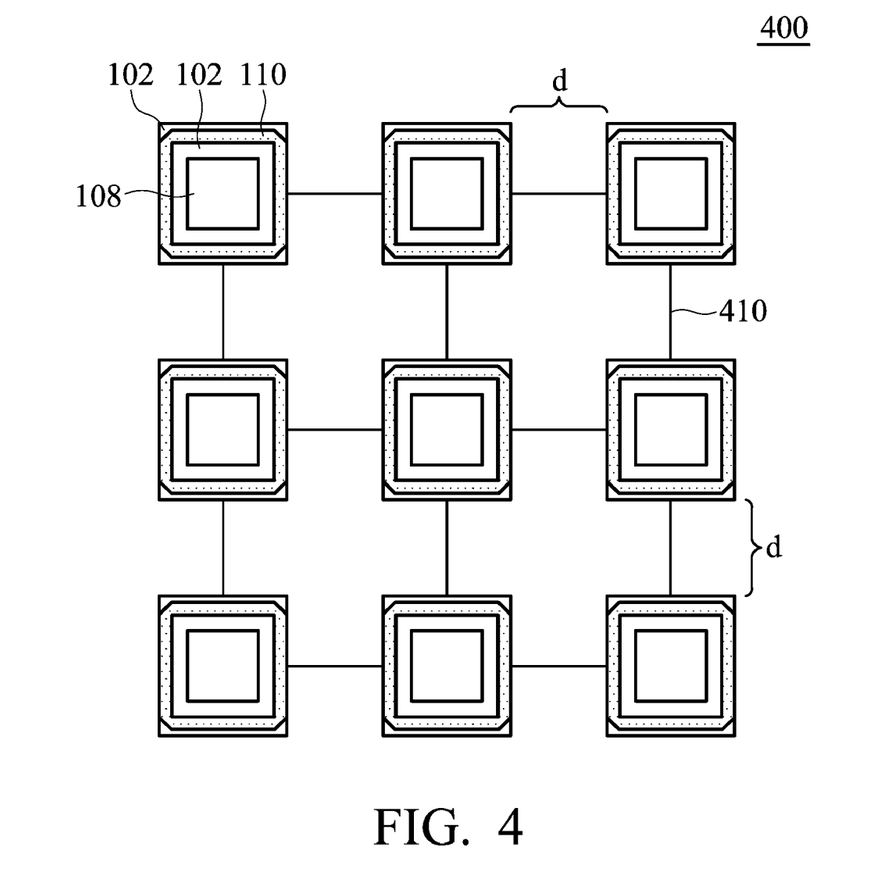
FIG. 4 shows a second embodiment of a light emitting device.

FIG. 4 shows a second embodiment of a light emitting device.

As shown in FIG. 4, this embodiment is similar to first embodiment, excluding that the light emitting system 400 features construction of many light emitting units 100 and a frame 410 for connection of the light emitting units 100. Specifically, there is an appropriate gap d between adjacent light emitting units 100, the gap d is determined with accordance to illumination and heat generated from the light emitting units 100. Number of the light emitting units 100 depends on the requirements. Various modifications can be made to arrangement of the light emitting units 100. The frame 410 is formed of metal materials.

With the use of the enclosed structure 110 of the embodiments, not only light from the side wall of the chip can be gathered but generation of heat sink can be avoided. That is, by means of various arrangements of the enclosed structures, such as series, parallel, concentric circle, or coil arrangement, and separation of chips in different enclosed structures, the chips are separately disposed in different enclosed structures so that generation of heat sink due to gather of chips can be avoided. Specifically, in a light emitting system 400, each light emitting unit on a cut substrate 102 is independent in connection to each other through a frame 410, and is spaced at a certain distance d to avoid accumulation of heat. A resultant light emitting system is constructed by the light emitting units. In still another embodiment, more excellent heat dissipation efficiency can be achieved by further utilizing a heat dissipation base underlying each light emitting unit. In doing so, heat accumulation can be avoided.

Third Embodiment

Figure 5:
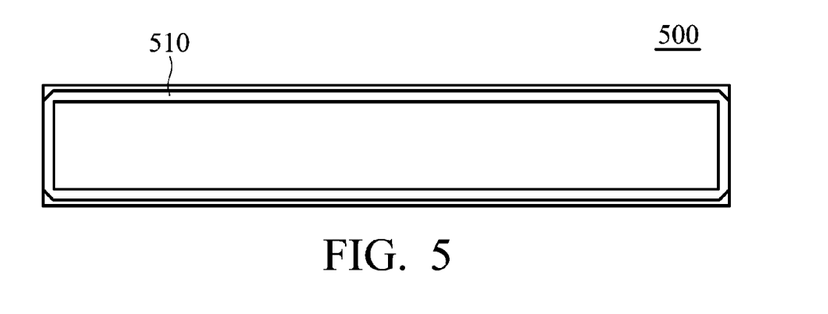
FIG. 5 shows a third embodiment of a light emitting device.

FIG. 5 shows a third embodiment of a light emitting device.

As shown in FIG. 5, this embodiment is similar to first embodiment, excluding that an area confined by the enclosed structure 510 is rectangular. In this embodiment, a light emitting system can be constructed by a single light emitting unit 500. Alternatively, a linear light emitting system can be constructed by a series of light emitting units 500.

Fourth Embodiment

Figure 6:
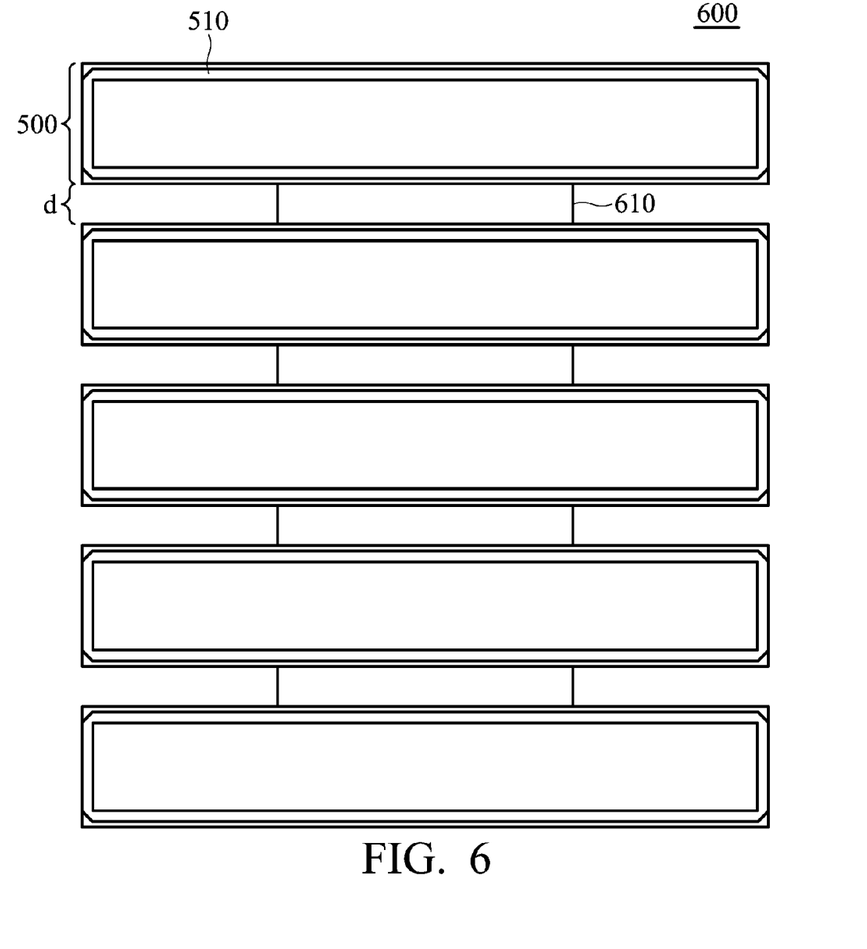
FIG. 6 shows a fourth embodiment of a light emitting device.

FIG. 6 shows a fourth embodiment of a light emitting device.

As shown in FIG. 6, this embodiment is similar to third embodiment, excluding that the light emitting units 500 are arranged in parallel, forming a light emitting system 600. Specifically, there is an appropriate gap d between adjacent light emitting units 500, the gap d is determined with accordance to illumination and heat generated from the light emitting units 500.

Fifth Embodiment

Figure 7:
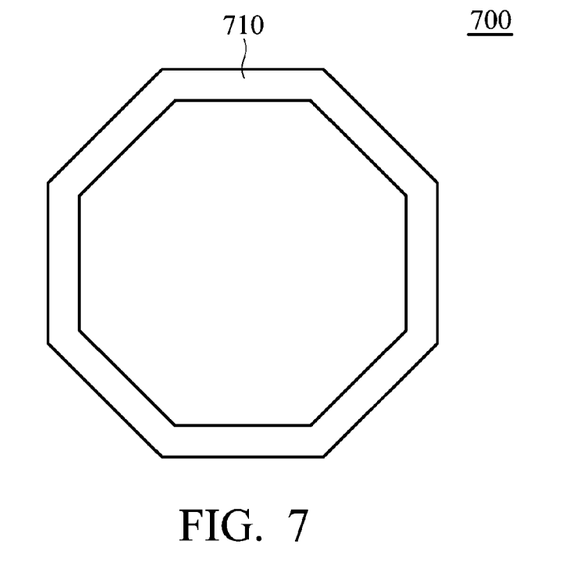
FIG. 7 shows a fifth embodiment of a light emitting device.

FIG. 7 shows a fifth embodiment of a light emitting device.

As shown in FIG. 7, this embodiment is similar to first embodiment, excluding that an area confined by the enclosed structure 710 is polygonal. In this embodiment, a light emitting system can be constructed by a single light emitting unit 700. In other embodiments, the area confined by the enclosed structure 710 is circular.

Sixth Embodiment

Figure 8:
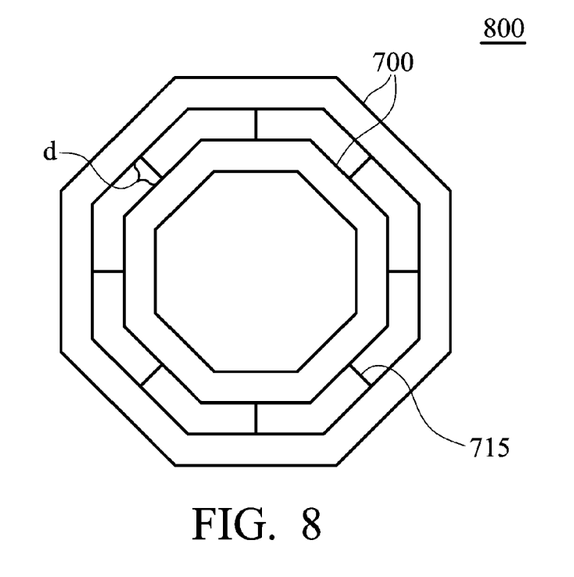
FIG. 8 shows a sixth embodiment of a light emitting device.

FIG. 8 shows a sixth embodiment of a light emitting device.

As shown in FIG. 8, this embodiment is similar to fifth embodiment, excluding that the light emitting units 700 are arranged in a coil (or vortex) manner, forming a light emitting system 800. Specifically, there is an appropriate gap d between adjacent light emitting units 700, the gap d is determined with accordance to illumination and heat generated from the light emitting units 700. In other embodiments, the area confined by the enclosed structure of the light emitting unit 700 can be circular, and the light emitting units 700 are arranged in a concentric circular manner (not shown).

It is noted that, in the six described embodiments, the chips are disposed in the enclosed structure, and number of the chips is determined according to application and requirements. In addition, the light emitting device of the six described embodiments can be selectively covered with seal materials.

Seven Embodiment

This application claims the benefit of U.S. application Ser. No. 11/059554, and China Pat. No. 200510008606.0. In this embodiment, a fabrication method of an LED is disclosed for convenience of illustration, but the invention should not be limited thereto.

Referring to FIG. 1A, a fabrication method regarding to the described embodiments is disclosed. The fabrication method includes the following steps described later, but the invention should not be limited thereto. Any modification can be made to the order of the steps, depending on requirements.

First, a substrate 102 with at least one chip array 104 thereon is provided. For example, the substrate 102 can be a copper clad laminate with an LED chip array thereon. An enclosed structure 110 is then disposed on the substrate 102, surrounding the chip array 104. The enclosed structure 110 may have a reflection surface coated with chrome, and can be formed of plastic materials. In addition, the enclosed structure 110 can be adhered to the substrate 102 via an adhesive.

A solution is then formed by mixing of phosphor powder and an adhesive-free liquid, and the substrate 102 is immersed in the solution so that the phosphor powder precipitates thereon. In other embodiments, the substrate 102 can be put in a container first, and formation a solution through mixing of phosphor powder and an adhesive-free liquid is then performed. Then pour the solution into the container, and the phosphor powder precipitates on the substrate 102.

Thereafter, a phosphor powder layer 106 is formed by the phosphor powder after removal of the liquid and the substrate, and is at least adhered to the chip array 104 in the enclosed structure 110. A passivation layer 108 is then formed to at least cover the phosphor powder layer 106.

In addition, by using the enclosed structure 110 of these embodiments, some problems in conventional precipitation methods can be improved. In other words, the phosphor powder after precipitating onto the substrate 102 would be divided into two regions by the enclosed structure 110, thus only few mixed solution outside the enclosed structure 110 is left therein after preliminary removal of the mixed solution. Because amount of the left mixed solution is far less than that of the original mixed solution, thus a phosphor powder layer 106 can be quickly formed on the chip(s) within the enclosed structure 110 through a baking process, leading to the rise of processing efficiency.

The following description is made to an embodiment of the deposition (precipitation) process. First, the phosphor powder s are put into the liquid, and the density of phosphor powder s are higher than the density of the liquid, and the phosphor powder s are insoluble or have low solubility in the liquid, and the phosphor powder s are stable in the liquid and have no chemical reaction with the liquid. The phosphor powder s is well mixed with the liquid by a stirring bar or ultrasonic agitation to form a mixture. The phosphor powder s may be phosphors, and the phosphors may be sulfide phosphors or non-sulfide phosphors. The sulfide phosphors further may be coated by a coating film, such as organic polymer coating film, to prevent the environmental factors, such as humidity and oxygen. The non-sulfide phosphors may be YAG, TAG or any other phosphors.

A substrate 102 having an enclosed structure 110 is put in the mixture for a period of time, and the height of the mixture must be higher than the substrate top surface of at least 10 μm. Then the phosphor powder s deposit on the substrate by gravity naturally. Thus, the density of the phosphor powder s must be higher than the liquid, or the deposition will not occur. The particle size of the phosphor powder s are typically 0.1~100 μm. If the particles are too small, the deposition time will be too long and the output would decrease. If the particles are too big, the uniformity of the phosphor powder layer will decrease. To achieve in phosphor powder layer thickness uniformity, the concentration of the phosphor powder s and the liquid is about 0.001~1 g/ml, preferably 0.01~15 g/ml. If the concentration is too high, the phosphor powder is wasted or the phosphor powder layer will be too thick. If the concentration is too low, the deposition time will be too long and the phosphor powder layer will be too thin. During the deposition process, the precipitated phosphor powder is divided by the enclosed structure. Before the deposition process, the chip array has been formed on the surface of the substrate within the enclosed structure. The chip array may be an LED array.

Finally, the liquid is preliminarily removed by drainage and/or pumping to form a phosphor powder layer on the substrate, leaving few mixed solution overlying the substrate in the enclosed structure. Subsequently, a phosphor powder layer is formed by instant baking, and the phosphor powder layer is adhered to the chip or the substrate in the enclosed structure. The liquid removing step must not agitate the phosphor powder layer, or the ideal phosphor powder layer can not be obtained. The baking temperature may be 40~300° C. If the baking temperature is too low, the baking time would be too long or the liquid is difficult to dry. If the baking temperature is too high, the substrate and/or the phosphor powder s can be spoiled, and the phosphor powder layer can be agitated. When the liquid is removed, the distance between the phosphor powder decreases, and the phosphor powder layer is formed by the intermolecular force, such as Van der Waal force. Furthermore, the baking step may comprise multiple baking steps, such as a first baking step and a second baking step. In the first baking step, the baking temperature may be lower than the liquid boiling point to prevent voids from forming on the phosphor powder layer surface. In the second baking step, the baking temperature may be higher to dry all the liquid and lower than the substrate or the phosphor powder spoiling temperature, 300° C. for example.

Furthermore, a passivation layer 108 may be formed on the phosphor powder layer 106 by a coating method. The passivation layer may 108 be organic polymer, and may extend to an interior surface of the enclosed structure to enhance the adhesive force.

In the above fabrication method, the liquid preferably is insoluble, barely soluble, and stable and has no chemical reaction with the phosphor powder s. The liquid may be water, alcohols, ketones and/or ethers. The alcohols may be ethanol, the ketons may be acetone, and the ethers may be ether.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

BRIEF DESCRIPTION OF NUMERALS IN THE DRAWINGS AS BELOW d: gap;
100: light emitting device;
102: substrate;
104: chip array;
106: phosphor powder layer;
108: passivation layer;
150: filling layer;
200: convex lens;
110、510、710: enclosed structure;
112: heat dissipation base;
400、500、600、700、800: light emitting system;
410、610、715: frame.

What is claimed is:

1. A light emitting device, comprising:
    a substrate with light emitting chips thereon;
    a layer comprising phosphor powder material over the light emitting chips;
    an enclosed structure surrounding the light emitting chips over the substrate, wherein the enclosed structure adjusts direction of light emitted from the light emitting chips;
    a passivation layer covering the layer comprising phosphor powder material, having an entire height lower than that of the enclosed structure; and
    a lens covering the substrate, the light emitting chips, the passivation layer and the enclosed structure, wherein the lens surrounds the enclosed structure.

2. The light emitting device as claimed in claim 1, wherein an area of the passivation layer corresponding the light emitting chips is a planarization layer.

3. The light emitting device as claimed in claim 2, wherein the passivation layer further extends to an interior surface of the enclosed structure.

4. The light emitting device as claimed in claim 1, wherein the passivation has a thickness t, and the enclosed structure has a thickness h, and wherein the relationship $h/2 \leq t \leq 2h/3$ is fulfilled.

5. The light emitting device as claimed in claim 1, wherein the enclosed structure is used for shielding, reflecting, collecting or focusing light emitted from the light emitting chips.

6. The light emitting device as claimed in claim 1, wherein the enclosed structure comprises plastic body and a reflection material layer thereon.

7. The light emitting device as claimed in claim 6, wherein the reflection material layer is plate.

8. The light emitting device as claimed in claim 1, wherein the enclosed structure is formed of materials having a reflection surface.

9. The light emitting device as claimed in claim 1, wherein the layer comprising phosphor powder material includes a plurality of phosphor particles and at least part thereof is coagulated and free of adhesive agents.

10. The light emitting device as claimed in claim 1, wherein the enclosed structure is a trapezium or a triangle.

11. The light emitting device as claimed in claim 1, wherein the interior surface of the enclosed structure is a planar or arc surface.

12. The light emitting device as claimed in claim 1, wherein the light emitting chips are arranged in a row within the enclosed structure.

13. A light emitting system, comprising:
    multiple light emitting units composed of the light emitting devices as claimed in claim 1; and
    a frame for connecting the light emitting units.

14. The light emitting device as claimed in claim 13, wherein there is a gap between two adjacent substrates, avoiding heat accumulation.

15. A method of fabricating a light emitting device, comprising:
    providing a substrate having chips thereon;
    providing an enclosed structure surrounding the chips over the substrate;
    mixing a plurality of phosphor particles and a liquid to form a mixed solution on the chips and substrate;
    removing the liquid, resulting in coagulation of the phosphor particles and formation of a layer comprising phosphor powder material on the substrate and chips within the enclosed structure;
    forming a passivation layer covering the layer comprising phosphor powder material, wherein the passivation layer having an entire height lower than that of the enclosed structure; and
    forming a lens covering the substrate, the light emitting chips, the passivation layer and the enclosed structure, wherein the lens surrounds the enclosed structure.

16. The method as claimed in claim 15, wherein at least a portion of the layer comprising phosphor powder material is adhesive-agent free.

17. The light emitting device as claimed in claim 15, wherein the passivation has a thickness t, and the enclosed structure has a thickness h, and wherein the relationship $h/2 \leq t \leq 2h/3$ is fulfilled.

* * * * *